United States Patent
Ohguro (10) Patent No.: US 6,987,309 B2
(45) Date of Patent: Jan. 17, 2006

(54) SEMICONDUCTOR DEVICE APPLIED TO A VARIABLE CAPACITANCE CAPACITOR AND AMPLIFIER

(75) Inventor: Tatsuya Ohguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/084,148

(22) Filed: Feb. 28, 2002

(65) Prior Publication Data

US 2003/0122155 A1 Jul. 3, 2003

(30) Foreign Application Priority Data

Dec. 27, 2001 (JP) ........................... 2001-398386

(51) Int. Cl.
*H01L 29/93* (2006.01)

(52) U.S. Cl. .......................... 257/596; 257/506
(58) Field of Classification Search ................ 257/596, 257/597, 598, 599, 600, 601, 602, 499, 500, 257/501, 505, 506, 509, 200, 510, 511, 512, 257/513, 516, 517
See application file for complete search history.

(56) References Cited

U.S. PATENT DOCUMENTS

| | | | |
|---|---|---|---|
| 5,057,443 A | 10/1991 | Hutter | |
| 5,087,579 A | 2/1992 | Tomassetti | |
| 5,627,097 A | 5/1997 | Venkatesan et al. | |
| 5,627,402 A | 5/1997 | Takemura | |
| 5,742,090 A | * | 4/1998 | Stolmeijer et al. .......... 257/510 |
| 6,191,451 B1 | * | 2/2001 | Nowak et al. .............. 257/347 |
| 6,396,090 B1 | * | 5/2002 | Hsu et al. .................... 257/242 |

FOREIGN PATENT DOCUMENTS

| | | | |
|---|---|---|---|
| CN | 409353 | | 10/2000 |
| JP | 61-127147 | | 6/1986 |
| JP | 61-236154 | | 10/1986 |
| JP | 63-207173 | | 8/1988 |
| JP | 2-184081 | | 7/1990 |
| JP | 3-147375 | | 6/1991 |
| JP | 4-330730 | | 11/1992 |
| JP | 5-243490 | | 9/1993 |
| JP | 5-315545 | | 11/1993 |
| JP | 06151896 A | * | 5/1994 |
| JP | 7-147420 | | 6/1995 |
| JP | 11-233799 | | 8/1999 |
| JP | 2000-174283 | | 6/2000 |
| KR | 2000-0047907 | | 7/2000 |

* cited by examiner

*Primary Examiner*—Hoai Pham
*Assistant Examiner*—Dana Farahani
(74) *Attorney, Agent, or Firm*—Oblon, Spivak, McClelland, Maier & Neustadt, P.C.

(57) ABSTRACT

A first conductivity type well area is formed in a semiconductor substrate. A second conductivity type semiconductor layer is formed at a first area of a well area which is separated by element isolation areas. In a base portion of the well area, a first conductivity type low resistance area is provided.

22 Claims, 7 Drawing Sheets

SEMICONDUCTOR DEVICE APPLIED TO A VARIABLE CAPACITANCE CAPACITOR AND AMPLIFIER

CROSS-REFERENCE TO RELATED APPLICATIONS

This application is based upon and claims the benefit of priority from the prior Japanese Patent Application No. 2001-398386, filed Dec. 27, 2001, the entire contents of which are incorporated herein by reference.

BACKGROUND OF THE INVENTION

1. Field of the Invention

The present invention relates to a semiconductor device applied to a variable capacitance capacitor and amplifier for use in an analog circuit for example.

2. Description of the Related Art

A voltage controlled oscillator includes a capacitor of a variable capacitance and can generate an oscillation signal of a predetermined frequency by varying the capacitance of the variable capacitor. The voltage controlled oscillator needs a high Q value so as to reduce phase noise. In order to achieve this, a lower parasitic capacitance and lower parasitic resistance are needed as the characteristics of the variable capacitor.

Generally, a variable capacitor is constructed by using a junction portion of a $P^+$ type semiconductor layer formed in an N type well area or a junction portion of an $N^+$ layer formed in a P type well area.

Figure 17:
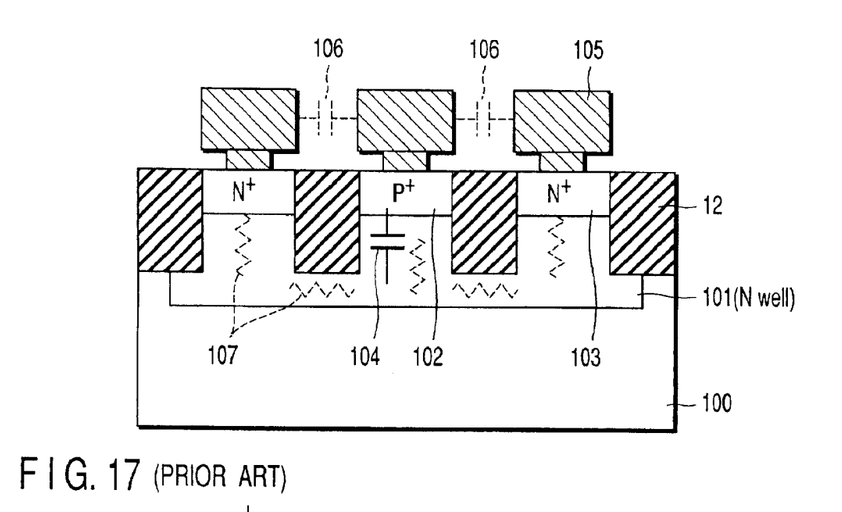
FIG. 17 is a cross-sectional view showing one practical form of a general variable capacitance capacitor.

FIG. 17 shows one practical form of a capacitor of a variable capacitance using an N type well area. For example, an N type well area 101 is formed in a surface area of, for example, a P type semiconductor substrate 100. In the N type well area 101, a $P^+$ type semiconductor layer 102 and $N^+$ type semiconductor layer 103 are provided. A variable capacitance capacitor 104 is constructed by using a junction portion of the $P^+$ type semiconductor layer 102 and N type well area 101. A connection line 105 is connected to the respective semiconductor layers 102 and 103. In the variable capacitor 104, a capacitance 106 between connection lines 105 is dominant as a parasitic capacitance and, as a parasitic resistance, a connection line resistance (not shown) and well area resistance (hereinafter referred to also as a "well resistance") are dominant.

As a result of advances in the design rule of the device, a smaller space can be achieved between the $P^+$ type semiconductor layer 102 and the $N^+$ type semiconductor layer 103. Owing to this, it is possible to reduce the parasitic resistance of the well area 101. Where, however, the space between the $P^+$ type semiconductor layer 102 and the $N^+$ semiconductor layer 103 is made smaller, a distance between the connection lines 105 is made narrower. As a result, a connection line-to-connection line capacitance 106 as a parasitic capacitance is increased.

Figure 18:
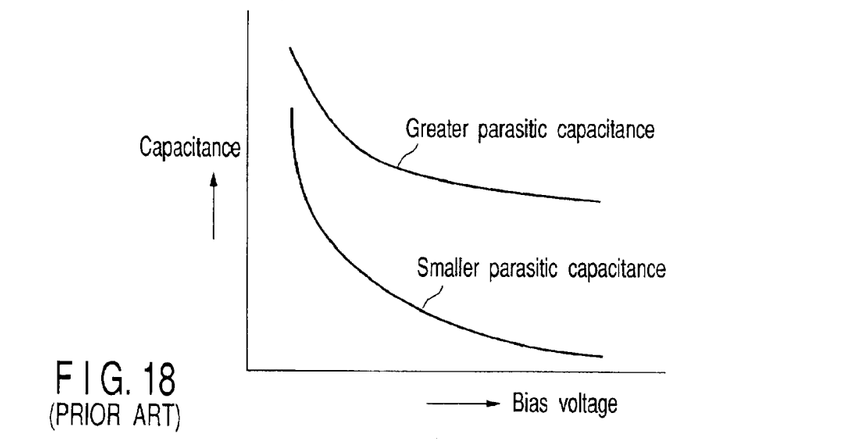
FIG. 18 shows the characteristics of one practical form of a variable capacitance capacitor shown in FIG. 17.

FIG. 18 shows a variance state between the capacitance and a bias voltage applied between the $P^+$ type semiconductor layer 102 and the $N^+$ semiconductor layer 103. As shown in FIG. 18, when the parasitic capacitance increases, the range of the capacitance responsive to the bias voltage is lowered. In order to reduce the connection line-to-connection line capacitance, therefore, it is necessary to broaden the space between the $P^+$ type semiconductor layer 102 and the $N^+$ semiconductor layer 103 and, thereby, to form a variable capacitance capacitor. This means that the well resistance cannot be lowered.

On the other hand, the parasitic resistance is a source of thermal noise, and is proportional to the resistance. This causes a lowering in Q value in the voltage controlled oscillator for example and causes a degeneration resulting from the phase noise.

Figure 19:
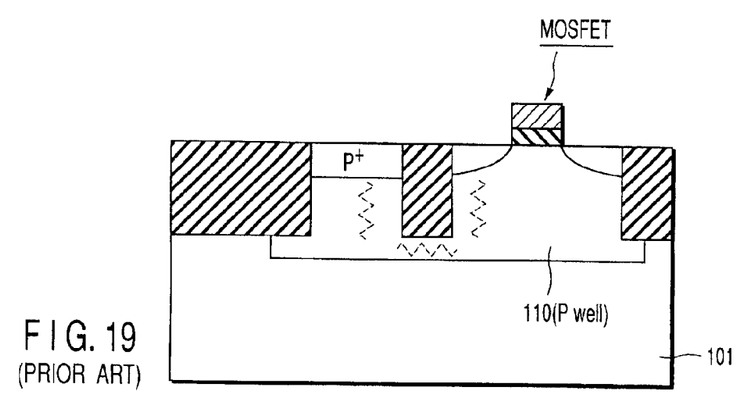
FIG. 19 is a cross-sectional view showing one practical form of a general amplifier.

Further, as shown in FIG. 19, a MOS transistor (hereinafter referred to as a MOSFET) in an amplifier, being greater in the resistance of a P type well area 110, causes a power loss and it is difficult to construct a high gain amplifier. In general, this type of amplifier is mounted in combination with a digital circuit. However, the resistance of the well used in a current digital circuits lowers the gain of the amplifier.

Figure 20:
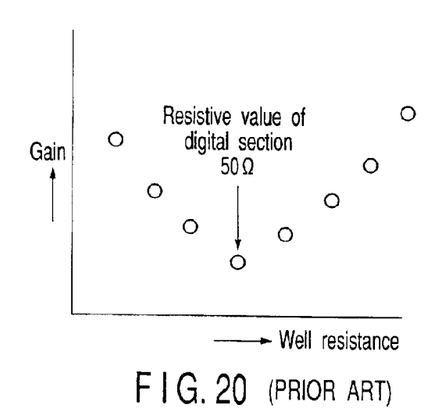
FIG. 20 is a view showing one practical form of a general amplifier shown in FIG. 19.

FIG. 20 shows a relation of the well resistance to the gain. In the current analog/digital hybrid semiconductor devices, the resistive value of the well used in the digital section is, for example, 50 Ω. In the case of the well resistance, it is difficult to obtain a high gain. As is evident from this figure, in order to raise the gain, it is necessary that the well resistance be raised or lowered. It may be considered that, in order to raise the well resistance, use is made of a high resistance substrate. However, there occurs, for example, a problem, such as a slip in the wafer. It may also be considered that, in order to lower the well resistance, use is made of a low resistance substrate.

Figure 21:
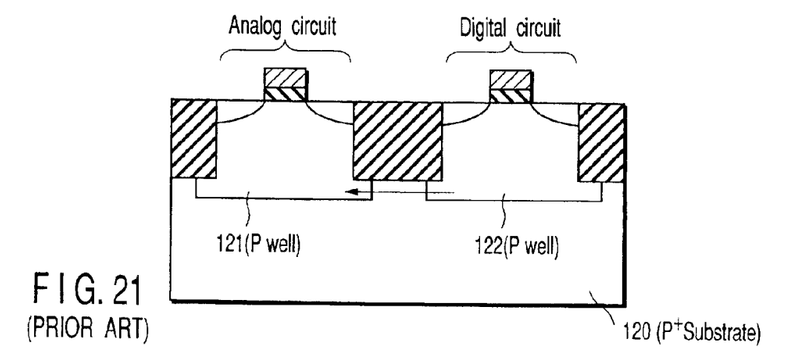
FIG. 21 is a cross-sectional view showing one practical form of a general analog/digital hybrid semiconductor device.

FIG. 21 shows one practical form of an analog/digital hybrid semiconductor device using a low resistance substrate. Well areas 121 and 122 are formed in a $P^+$ substrate 120 serving as a low resistance substrate and, in the well areas 121 and 122, an analog circuit and digital circuit are formed. In this way, the well resistance can be lowered in the case of using the low resistance substrate. In the case of lowering the well resistance, noise from the digital circuit enters the analog circuit, thus exerting an adverse effect on the characteristics of the analog circuit.

Figure 22:
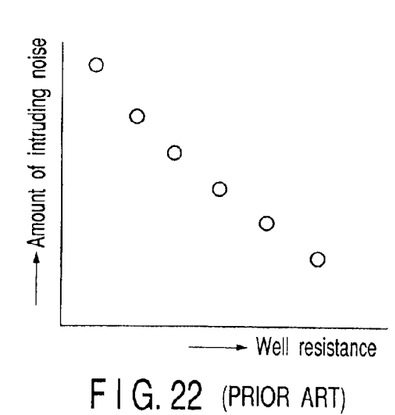
FIG. 22 is a view showing the characteristics of the analog/digital hybrid semiconductor device shown in FIG. 21.

FIG. 22 shows the relation between the well resistance and amount of intruding noise. As evident from the above, the higher the amount of intruding noise, the lower the well resistance. In an analog/digital hybrid semiconductor device, it is thus not possible to adopt a low resistance substrate.

A semiconductor device is therefore desired which is capable of improving the characteristics of the circuit elements by setting the resistive value of the well in accordance with the kinds of the circuit elements.

BRIEF SUMMARY OF THE INVENTION

According to an aspect of the present invention, there is provided a semiconductor device comprising a semiconductor substrate; a first conductivity type well area formed in a surface area of the semiconductor substrate; a plurality of element isolation areas formed in the well area; a second conductivity type semiconductor layer formed in a first area of the well area which is isolated by the element isolation areas, the second conductivity type semiconductor layer configuring a first electrode of a capacitor; and a first conductivity type low resistance area provided at a base portion of the well area, the low resistance area having a resistive value lower than that of the well area.

DETAILED DESCRIPTION OF THE INVENTION

Embodiments of the present invention will be described below with reference to the accompanying drawing.

(First Embodiment)

Figure 1:
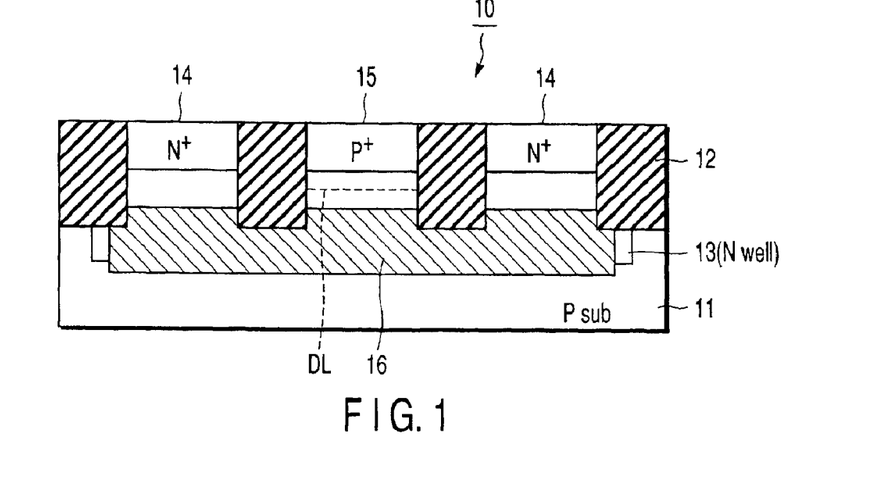
FIG. 1 is a cross-sectional view showing a variable capacitance capacitor according to a first embodiment of the present invention.

FIG. 1 shows a variable capacitance capacitor according to a first embodiment of the present invention. The variable capacitance capacitor 10 uses a junction portion between, for example, an N type well area 13 and a P$^+$ type semiconductor layer 15.

For example, a P type semiconductor substrate 11 has a resistance of, for example, 1 to 5 Ωcm. A plurality of element isolation areas 12 are formed in a surface area of the substrate 11 and comprised of, for example, STI (Shallow Trench Isolation) areas. The well area 13 is formed in the surface area of the semiconductor substrate 11 where these element isolation areas 12 are formed. The P$^+$ type semiconductor layer 15 is formed in the first area of the well area 13 which is isolated by the element isolation areas 12. An N$^+$ type semiconductor layer 14 is formed in a second area situated around the semiconductor layer 15. The P$^+$ type semiconductor layer 15 constitutes a first electrode of the variable capacitance capacitor and the N$^+$ type semiconductor layer 14 constitutes a second electrode.

At the bottom portion of the well area 13, for example, an N type low resistance area 16 is formed. This low resistance area 16 is set to be higher in impurity concentration than the well area 13 and to be lower in resistive value than the well area 13. Stated in more detail, the impurity concentration of the low resistance area 16 is set to be, for example, above 2 times, or above $1 \times 10^{18}$ cm$^{-3}$, that of the well area 13. This low resistance area 16 does not contact a depletion layer DL at a junction portion between, for example, the P$^+$ type semiconductor layer 15 and the well area, and does contact the bottom portion of each element isolation area 12.

Next an explanation will be made below about the manufacturing method of the variable capacitance capacitor set out above.

Figure 2:
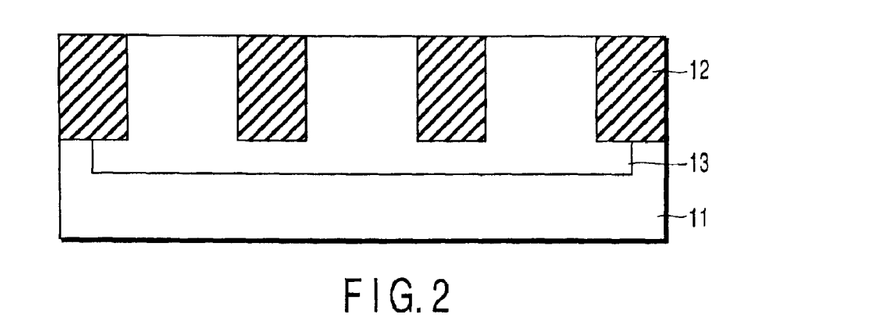
FIG. 2 is a cross-sectional view showing a manufacturing method of a device shown in FIG. 1.

As shown in FIG. 2, a plurality of element isolation areas 12 comprised of STI are formed at the surface area of, for example, a P type semiconductor substrate 11. The element isolation areas 12 are produced by a well known process. That is, first, trenches are formed in the surface portion of a substrate 11. Then, a silicon oxide film is deposited by, for example, by CVD (Chemical Vapor Deposition) over the whole surface of the substrate 11 to allow the trenches to be buried with the silicon oxide film. Then, the silicon oxide film on the substrate 11 is removed by, for example, CMP (Chemical Mechanical Polishing).

After this, an N type impurity, such as phosphorus, is ion implanted in the surface area of the substrate 11 to provide an N type well area 13. The depth of the well area 13 is greater than the depth of the element isolation area 12.

Figure 3:
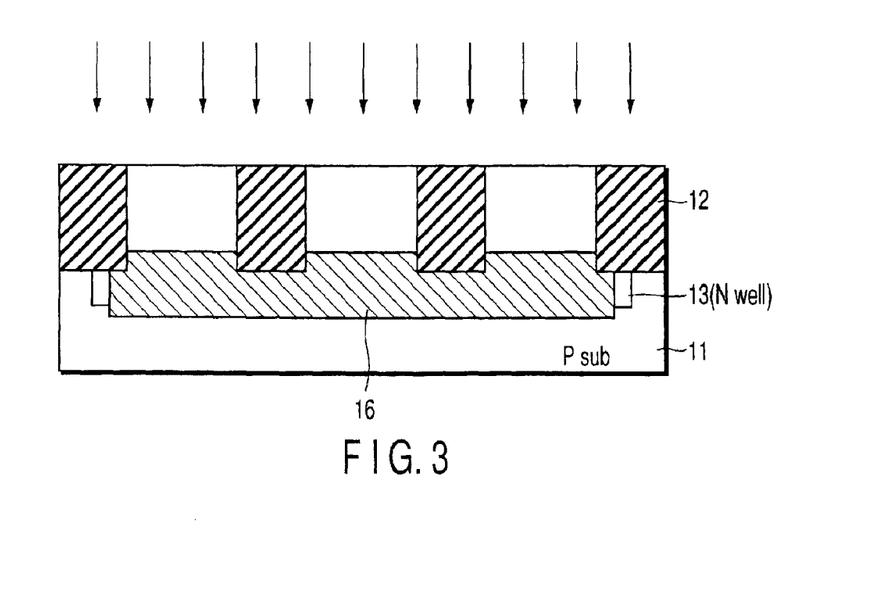
FIG. 3 is a cross-sectional view showing a manufacturing process subsequent to that shown in FIG. 2.

Then, as shown in FIG. 3, an N type impurity, such as phosphorus, is ion implanted into the whole surface portion of the well area 13 to provide a low resistance area 16. The ion implanting conditions are such that, for example, the acceleration voltage is 1000 to 2000 KeV and the dosage is $1 \times 10^{13}$ to $1 \times 10^{14}$ cm$^{-2}$. The ion implanting conditions are an example and they may be varied so long as the depth of the low resistance area 16 is such that it is not in contact with a depletion layer of the P$^+$ semiconductor layer 15 and is in contact with the bottom portion of the element isolation area 12, as shown in FIG. 1. By doing so, the impurity concentration at the bottom portion of the well area 13 is raised.

After this, as shown in FIG. 1, a P type impurity, such as boron, is ion implanted into a first area of the well area 13 to provide a P$^+$ type semiconductor layer 15. Then an N type impurity, such as phosphorus, is ion implanted in a second area of the well area 13 to provide an N$^+$ type semiconductor layer 14.

Figure 4:
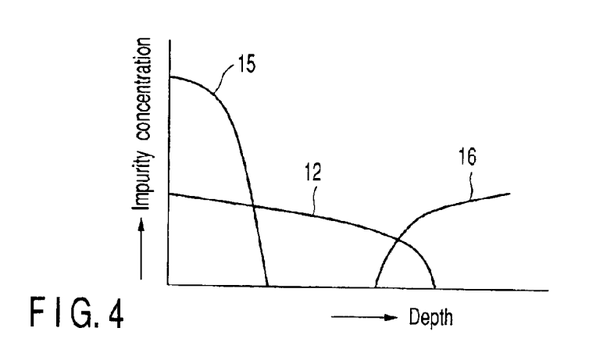
FIG. 4 is a view showing an impurity concentration of a major section of FIG. 1.

FIG. 4 diagrammatically shows an impurity concentration of each part in the well area 13, and the depth. The same reference numerals are employed to designate corresponding parts or portions in FIGS. 1 to 3.

According to the first embodiment, a low resistance area 16 is formed at the bottom portion of the well area 13 where a variable capacitance capacitor 10 is formed. By doing so, the well resistance is lowered. Even if, therefore, a space is broadened between the P$^+$ type semiconductor layer 15 and the N$^+$ type semiconductor layer 14 so as to reduce a connection line to connection line capacitance, it is possible to keep a well resistance at a low level and thus to suppress thermal noise.

Further, since this variable capacitance capacitor involves less thermal noise, if it is used in a voltage controlled oscillator, it is possible to improve the Q value of the voltage controlled oscillator, and to reduce the phase noise.

(Second Embodiment)

Figure 5:
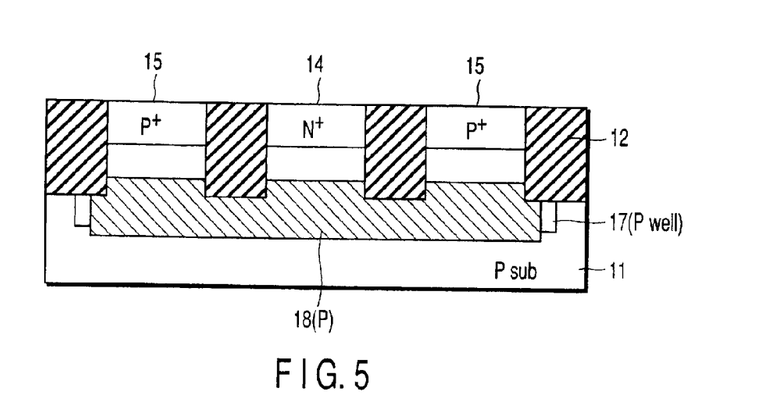
FIG. 5 is a cross-sectional view showing a variable capacitance capacitor according to a second embodiment of the present invention.

FIG. 5 shows a second embodiment of the present invention. The second embodiment constitutes a modification of the present invention with the same reference numerals employed to designate parts or portions corresponding to those shown in the first embodiment.

A variable capacitance capacitor 10 shown in FIG. 5 uses a junction portion between, for example, a P type well area 17 and an N$^+$ type semiconductor layer 14. That is, for example, a P type well area 17 is formed, for example, in a P type semiconductor substrate 11. In the central portion of the well area 17 the N$^+$ type semiconductor layer 14 is provided. A P$^+$ type semiconductor layer 15 is formed around the semiconductor layer 14.

Further, a low resistance area 18 is formed at the bottom portion of the well area 17. The low resistance area 18 is not in contact with a depletion layer at the junction portion of, for example, the N$^+$ type semiconductor layer 14 and the well area 17 but is in contact with the bottom portion of respective element isolation areas 12. The impurity concentration of the low resistance area 18 is set to be higher than, for example, the P type well area 17. Stated in more detail, the impurity concentration of the low resistance area 18 is set to above 2 times, or above 1×10$^{18}$ cm$^{-3}$, that of the low resistance area 17.

The manufacturing method of the variable capacitance capacitor thus structured is the same as that of the first embodiment. The ion injection conditions for forming the low resistance area 18 are such that, for example, the ion species is boron, the acceleration voltage is 1000 to 2000 KeV and the dosage is 1×10$^{13}$ to 1×10$^{14}$ cm$^{-2}$.

With the second embodiment, it is also possible to obtain the same advantage as that of the first embodiment.

(Third Embodiment)

Figure 6:
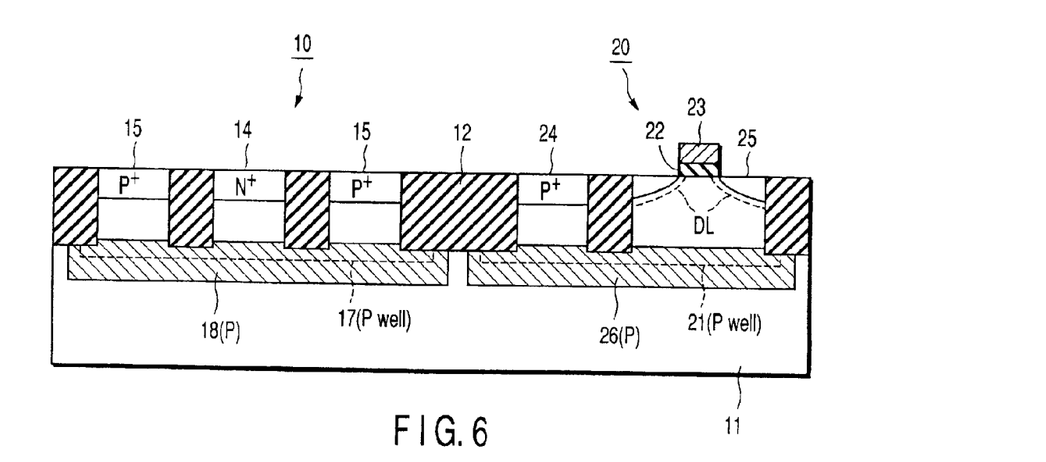
FIG. 6 is a cross-sectional view showing a variable capacitance capacitor according to a third embodiment of the present invention.

FIG. 6 shows a third embodiment of the present invention in which an amplifier comprises a variable capacitance capacitor and a MOSFET. The structure of the variable capacitance capacitor 10 is the same as that shown in FIG. 5 and the same reference numerals are employed to designate parts or portions corresponding to those shown in FIG. 5 and further explanation of them is, therefore, omitted. The third embodiment shows the variable capacitance capacitor 10 comprising a P type well area 17 and N$^+$ semiconductor layer 14 and an N channel MOSFET 20. However, the capacitor and conductivity type of the transistor are not restricted thereto.

In FIG. 6, the MOSFET 20 is formed at a P type well area 21. That is, a gate oxide film 22 is formed on a first area of a well area 21 which is separated by element isolation areas 12. A gate electrode 23 is formed on the gate oxide film 22 and formed of polysilicon. Source and drain regions 25 are provided in the well area 21 on each side of the gate electrode 23.

Further, a P$^+$ type semiconductor layer 24 is formed at a second area of the well area 21 which is separated by the element isolation areas 12. The semiconductor layer 24 functions as a power supply node for supplying a voltage to the well area 21.

A low resistance area 26 is formed at the bottom portion of the well area 21. The depth to which the low resistance area 26 is formed is substantially the same as that of the low resistance area 18. That is, the low resistance area is not in contact with a depletion layer of the source and drain regions of the MOSFET 20 but is in contact with the bottom portion of the respective element isolation area 12. The impurity concentration of the low resistance area 26 is set to be higher than, for example, the P type well area 21. Stated in more detail, the impurity concentration of the low resistance area 26 is set to be, for example, above 2 times, or above 1×10$^{18}$ cm$^{-3}$, that of the well area 21.

Now, the manufacturing method of the semiconductor device will be explained below.

In the third embodiment, the variable capacitance capacitor 10 and MOSFET 20 are formed at the same time.

Figure 7:
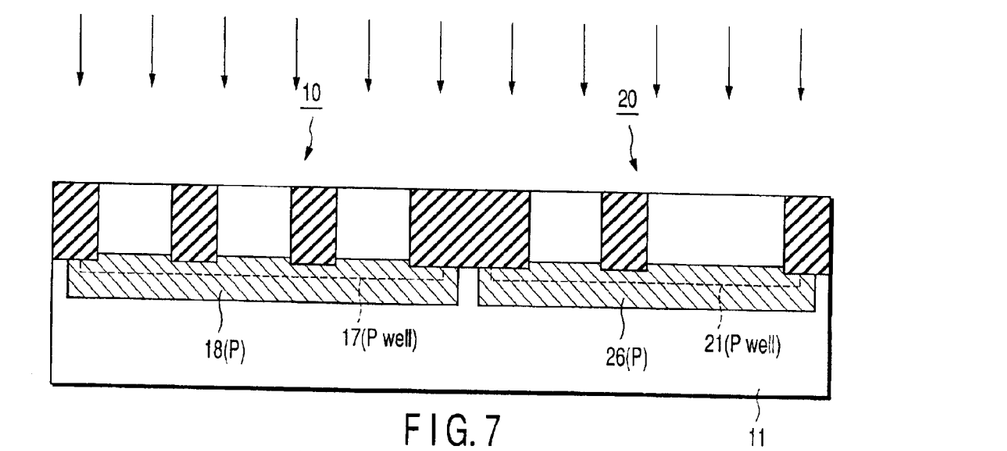
FIG. 7 is a cross-sectional view showing the manufacturing method of a device shown in FIG. 6.

As shown in FIG. 7, first, a plurality of element isolation areas 12 are formed, for example, in a P type semiconductor substrate 11. After this, P type well areas 17 and 21 are formed at a variable capacitance capacitor 10 formation area and MOSFET 20 formation area.

Then, as a P type impurity, for example, boron is ion implanted in the whole surface portion of the substrate 11 to raise an impurity concentration at the bottom portions of the well areas 17 and 21. The ion implantation conditions are such that, for example, the acceleration voltage is 1000 to 2000 KeV and the dosage is 1×10$^{13}$ to 1×10$^{14}$ cm$^{-2}$. By doing so, low resistance areas 18 and 26 are formed at the bottom portions of the well areas 17 and 21.

After this, as shown in FIG. 6, a gate oxide film 22 is formed on a well area 21 at a MOSFET 20 formation area and a gate electrode 23 is formed on the gate oxide film 22.

Then, source and drain regions 25 are formed simultaneously with the formation of an N$^+$ semiconductor layer 14 in the variable capacitance capacitor 10. Further, a P$^+$ semiconductor layer 24 serving as a power supply node is formed simultaneously with the formation of a P$^+$ semiconductor layer 15 in the variable capacitance capacitor 10.

It is to be noted that, first, the P$^+$ semiconductor layers 15 and 24 may be formed and, then, the N$^+$ semiconductor layer 14 and source and drain regions 25 be formed.

Further, the low resistance areas 18 and 26 can also be formed after the formation of a variable capacitance capacitor 10 and MOSFET 20.

According to the third embodiment, the low resistance area 26 is formed at the bottom portion of the well area 21 where an amplifier 20 is formed. It is, therefore, possible to reduce a parasitic resistance in the well area 21. It is thus possible to lower a power loss and to construct a high gain amplifier.

(Fourth Embodiment)

Figure 8:
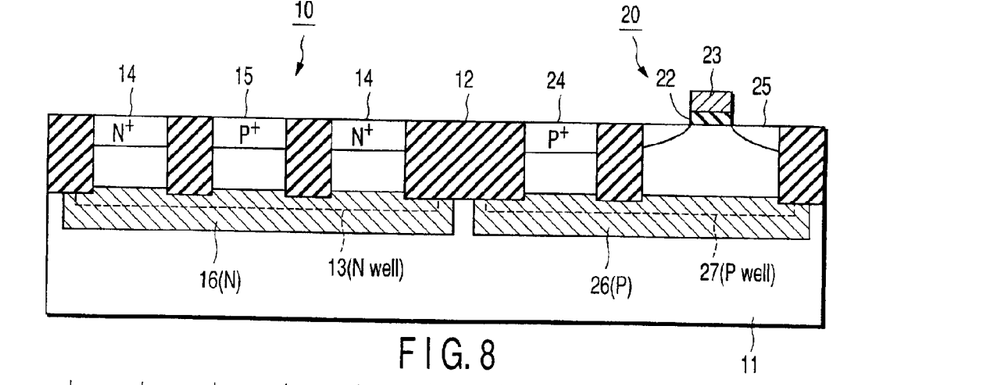
FIG. 8 is a cross-sectional view showing a variable capacitance capacitor according to a fourth embodiment of the present invention.

FIG. 8 shows a fourth embodiment of the present invention, which is a modification of the third embodiment.

In FIG. 8, a MOSFET 20 is the same as in the third embodiment and a variable capacitance capacitor 10, as in the first embodiment, is provided by using a junction portion of, for example, an N type well area 13 and P$^+$ type semiconductor layer 15. An N type low resistance area 16 is formed at the well area 13 of the variable capacitance capacitor 10 and a P type low resistance area 26 is formed at a well area 27 of the MOSFET 20. An explanation will be made below about the forming method of different conductivity type low resistance areas.

Figure 9:
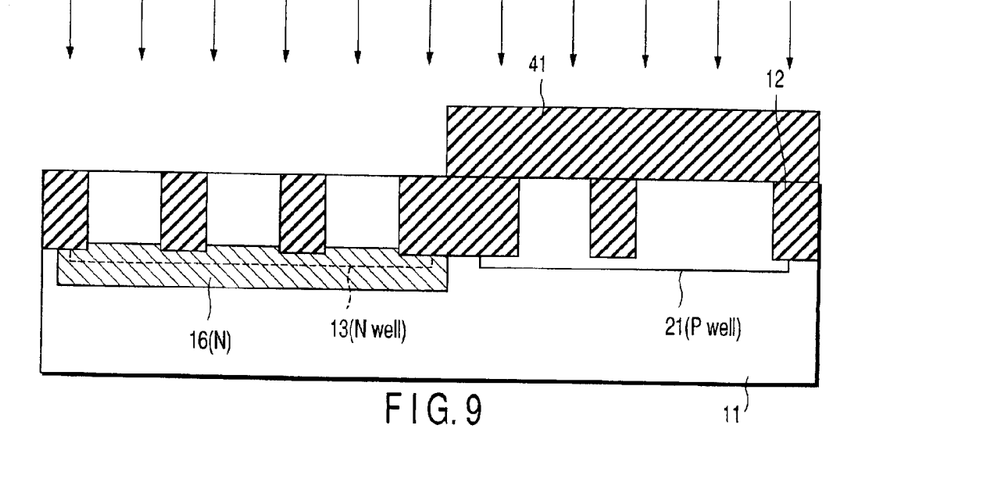
FIG. 9 is a cross-sectional view showing a manufacturing method of a device shown in FIG. 8.

As shown in FIG. 9, first, a plurality of element isolation areas 12 are formed in, for example, a P type semiconductor substrate 11. After this, an N type well area 13 is formed at a variable capacitance capacitor formation area and a P type well area 21 is formed at a MOSFET formation area. That is, for example, the MOSFET 20 formation area is covered with a resist film 41. With the resist film 41 used as a mask, an N type impurity, such as phosphorus, is ion implanted into the substrate and an N type low resistance area 16 is formed at the bottom portion of the well area 13.

Figure 10:
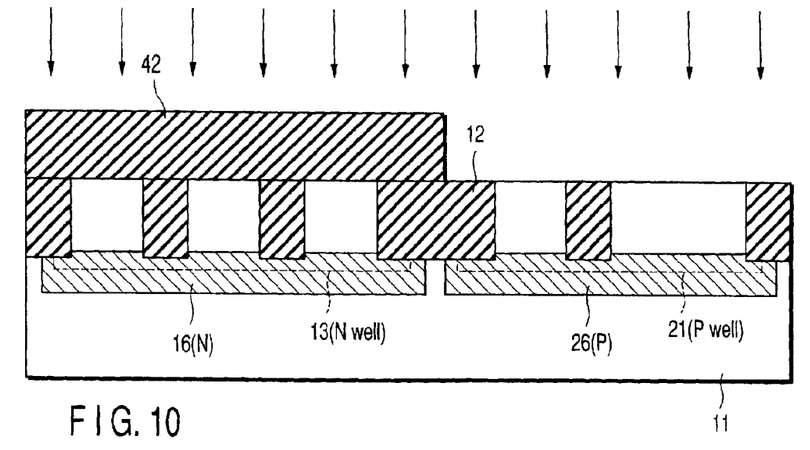
FIG. 10 is a cross-sectional view showing a manufacturing process subsequent to that of FIG. 9.

Then, as shown in FIG. 10, the resist film 41 is removed. After this, a resist film 42 is covered on a variable capacitance capacitor formation area. With this resist film 42 used as a mask, a P type impurity, such as boron, is ion implanted into the substrate and a low resistance area 26 is formed at the bottom portion of the well area 21. The ion implantation conditions are the same as those of the second and third embodiments.

After the formation of the low resistance areas 16 and 26 as set out above, the variable capacitance capacitor and MOSFET are formed by the process as set out above.

With the fourth embodiment, it is also possible to obtain the same advantage as that of the third embodiment.

(Fifth Embodiment)

Figure 11:
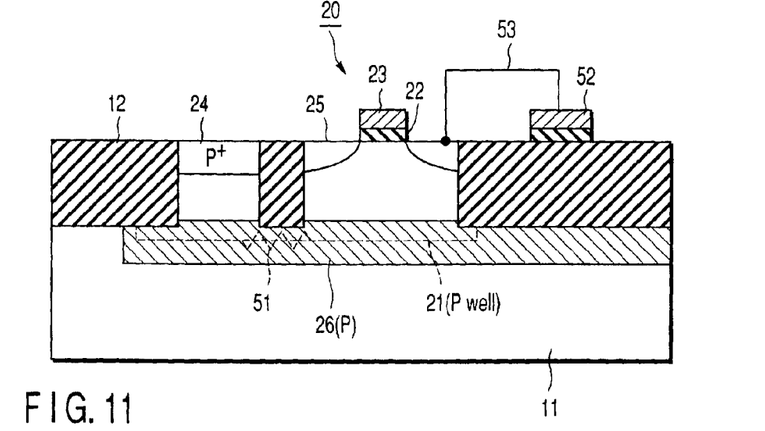
FIG. 11 is a cross-sectional view showing an amplifier according to a fifth embodiment of the present invention.
Figure 12:
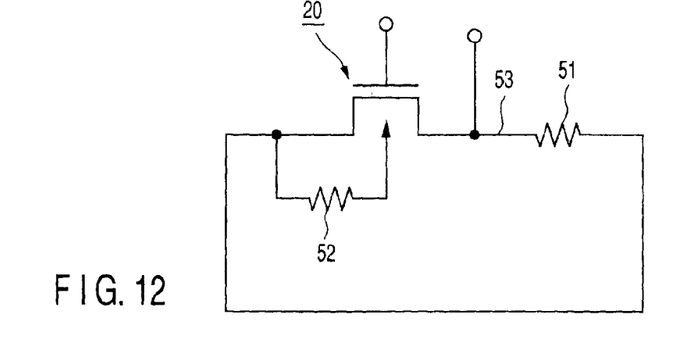
FIG. 12 is an equivalent circuit diagram of a device shown in FIG. 11.

FIGS. 11 and 12 show a fifth embodiment of the present embodiment. FIG. 11 shows a power amplifier and FIG. 12 shows an equivalent circuit shown in FIG. 11. The structure of the amplifier as shown in FIG. 11 is basically similar to that of the amplifier shown in FIG. 6. That is, a low resistance area 26 is formed at a well area 21 where a MOSFET 20 is formed. The low resistance area 26 is indicated by a resistor 51 in the equivalent circuit shown in FIG. 12. A load resistor 52 is connected via, for example, an aluminum connection line 53 to one end of a current path of the MOSFET 20. This load resistor 52 is formed simultaneously with the formation of, for example, a gate electrode 23 and its resistive value is set through the implantation of an impurity.

According to the fifth embodiment, the low resistance area 26 is formed at a lower portion of the well area 21 where the MOSFET 20 is formed. It is, therefore, possible to lower a power loss and construct a high gain amplifier.

(Sixth Embodiment)

Figure 13:
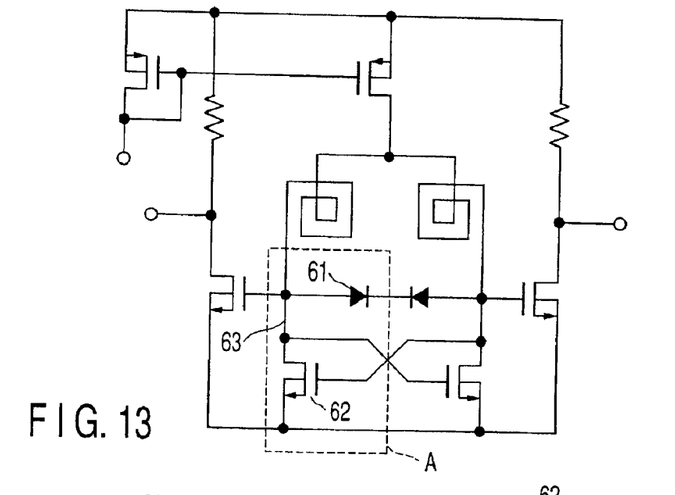
FIG. 13 is a circuit diagram showing a practical form of a voltage controlled oscillator according to a sixth embodiment of the present invention.
Figure 14:
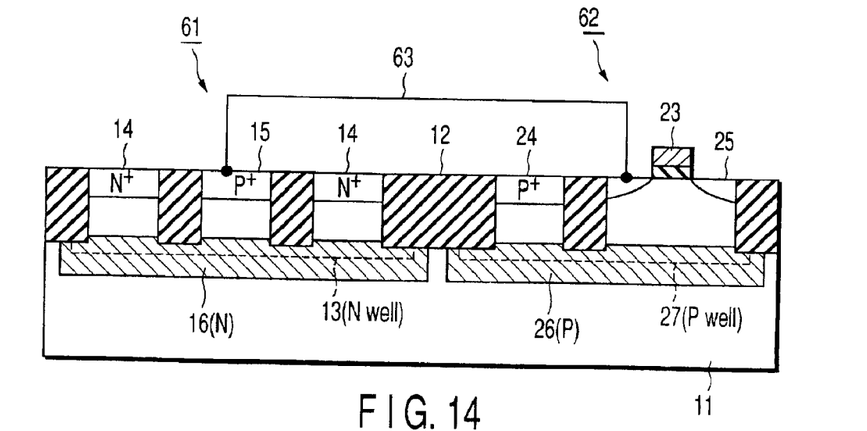
FIG. 14 is a cross-sectional view showing a major section of FIG. 13.

FIGS. 13 and 14 show a sixth embodiment of the present invention. FIG. 13 shows one practical form of a voltage controlled oscillator using a variable capacitance diode as a variable capacitance capacitor. FIG. 14 shows a cross-sectional view of the variable capacitance capacitor 61 and MOSFET 62 corresponding to an A section in FIG. 13.

The cross-sectional view shown in FIG. 14 is basically similar in structure to that shown in FIG. 8. In FIG. 14, a P+ semiconductor layer 15 of the variable capacitance capacitor and the source of the MOSFET 62 are connected together through an aluminum connection line 63.

According to the sixth embodiment, the variable capacitance capacitor 61 has less parasitic resistance and a wider variable capacitance range and it is possible to obtain a high gain. By the use of the variable capacitance capacitor 61 and MOSFET 62 it is possible to construct a high performance voltage controlled oscillator having less phase nose.

(Seventh Embodiment)

Figure 15:
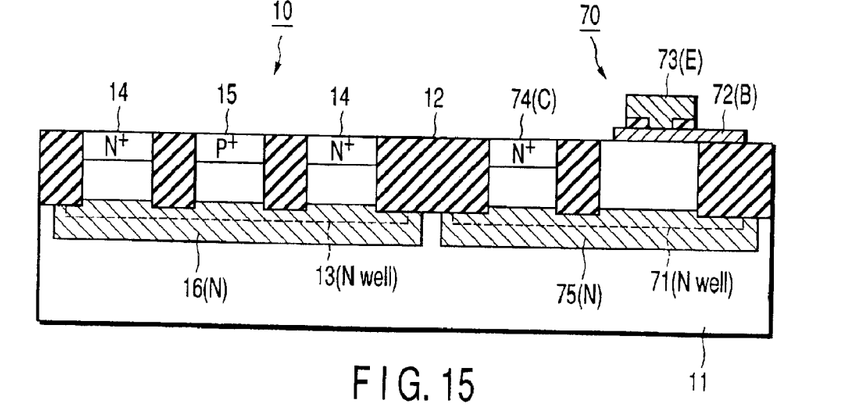
FIG. 15 shows a practical form of a bipolar transistor according to a seventh embodiment of the present invention.

FIG. 15 shows a seventh embodiment of the present invention. The seventh embodiment shows the case where the present invention is applied to a voltage controlled oscillator using a bipolar transistor. In FIG. 15, the structure of the variable capacitance capacitor 10 is similar to that of, for example, the first embodiment and an explanation of it is omitted.

In the bipolar transistor 70, for example, an N type well area 71 is formed in a substrate 11. The N type well area 71 functions as a collector layer. A P type base layer 72 is formed at a first area of the well area 71 which is isolated by element isolation areas 12. An N type emitter layer 73 is formed on the base layer 72. Further, an N+ type semiconductor 74 is formed at a second area of the well area 71 which is separated from the element isolation areas 12. The semiconductor layer 74 functions as a collector connection node.

An N type low resistance area 75 is formed at a base portion of the well area 71. The low resistance area 75 is formed together with a low resistance area 13 in the variable capacitance capacitor 10. The impurity concentration of the low resistance area 75 is the same as that of the MOSFET. The low resistance area 75 is formed to contact the bottom portion of the element isolation area 12 but not to contact the depletion layer between the collector and the base.

According to the seventh embodiment, the low resistance area 75 is formed at the base portion of the well area 71 where the bipolar transistor is formed. For this reason, it is possible to lower the well resistance and to construct a high gain amplifier of less power loss.

Although FIG. 15 shows an NPN type bipolar transistor, the present invention is not restricted thereto and it is possible to apply this embodiment to a PNP type bipolar transistor.

(Eighth Embodiment)

Figure 16:
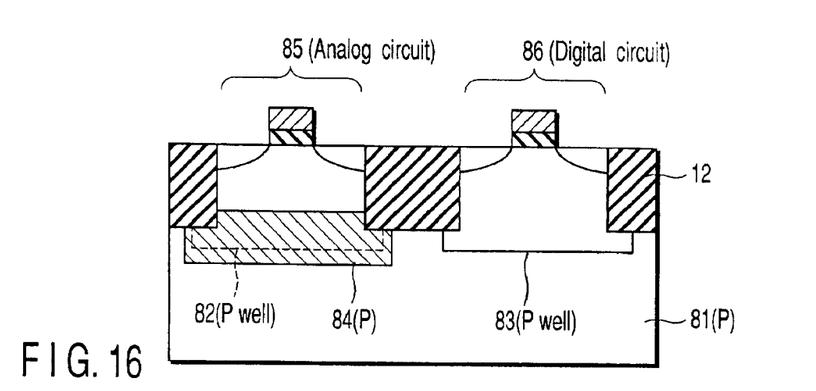
FIG. 16 is a cross-sectional view showing one practical form of an analog/digital hybrid semiconductor device according to the seventh embodiment of the present invention.

FIG. 16 shows an eighth embodiment of the present invention. The eighth embodiment shows the case where the present invention is applied to an analog/digital hybrid semiconductor device.

In FIG. 16, for example, a P type semiconductor substrate 81 is comprised of a relatively high resistance substrate having a resistive value of, for example, 30 to 500 Ω. In the surface area of the substrate 81, a plurality of element isolation areas 12 are provided. For example, a P type well area 82 is formed at a first area separated by these element isolation areas 12 and, for example, a P type well area 83 is formed at a second area. The impurity concentration of the well area 82 is set to, for example, be higher than the impurity concentration of the well area 83. For example, a MOSFET comprised of an analog circuit 85 is provided in the well area 82 and, for example, an MOSFET comprised of a digital circuit 86 is formed in the well area 83. For example, a P type low resistance area 84 is formed at the base portion of the well area 82 where the analog circuit 85 is formed. The formation position and impurity concentration of the low resistance area 84 are the same as those of the fourth and fifth embodiments. That is, the impurity concentration of the low resistance area 84 is set to, for example, above 2 times, or above $1\times10^{18}$ cm$^{-3}$, that of the well area 82 where the analog circuit 85 is formed. Therefore, the well resistance of the well area 82 where the analog circuit 85 is formed is set to be lower than the well resistance of the well area 83 where the digital circuit 86 is formed.

According to the eighth embodiment, the analog circuit 85 and digital circuit 86 are formed in the high resistance substrate 81. It is, therefore possible to prevent noise intrusion from the digital circuit 86 to the analog circuit 85. The low resistance area 84 is formed at the base portion of the well area 82 where the analog circuit 85 is formed. For this reason, possible to prevent a lowering in gain of the amplifier which configures the analog circuit 85. Further, where the analog circuit is comprised of, for example, a variable capacitance capacitor, it is possible to obtain a broader capacitance range.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a first conductivity type well area formed in a surface area of the semiconductor substrate;
   a plurality of element isolation areas formed in the well area;
   a second conductivity type semiconductor layer formed in a first area of the well area which is isolated by the element isolation areas, the second conductivity type semiconductor layer configuring a first electrode of a capacitor;
   a first conductivity type semiconductor layer formed in a second area of the well area which is isolated by the element isolation areas, the first conductivity type semiconductor layer configuring a second electrode of the capacitor; and
   a first conductivity type low resistance area having a resistive value lower than that of the well area, which is in contact with the element isolation areas, and is not in contact with a depletion layer of a junction portion between the second conductivity type semiconductor layer and the well area, and is not in contact with a depletion layer of a junction portion between the first conductivity type semiconductor layer and the well area,
   wherein the low resistance area is in contact with a base portion of the well area and connects said first and second areas.

2. The device according to claim 1, wherein the low resistance area is situated from the first conductivity type semiconductor layer to the second conductivity type semiconductor layer at a base portion of the well area.

3. The device according to claim 1, wherein the impurity concentration of the low resistance area is set to above 2 times that of the well area.

4. The device according to claim 3, wherein the impurity concentration of the low resistance area is set to above $1 \times 10^{18}$ cm$^{-3}$.

5. A semiconductor device comprising:
   a semiconductor substrate;
   a first well area formed in a surface area of the semiconductor substrate;
   a second well area formed in a surface area of the semiconductor substrate;
   a plurality of element isolation areas formed in the first and second well areas;
   a MOS transistor formed in a first area of the first well which is isolated by the element isolation areas;
   a first semiconductor layer with a first conductivity type formed in a second area of the first well area, which is isolated from the MOS transistor by the element isolation areas, the first semiconductor layer being a node for supplying a potential to the first well area; and
   a first low resistance area with a first conductivity type having a resistive value lower than that of the first well area, which is in contact with the element isolation areas, and is not in contact with a depletion layer of a junction portion between source/drain regions of the MOS transistor and first well area,
   wherein the first low resistance area is in contact with a base portion of the first well area and connects said first and second areas.

6. The device according to claim 5, wherein the low resistance area is situated from the first conductivity type semiconductor layer to the second conductivity type semiconductor layer at a base portion of the well area.

7. The device according to claim 5, wherein the impurity concentration of the low resistance area is set to above 2 times that of the well area.

8. The device according to claim 7, wherein the impurity concentration of the low resistance area is set to above $1 \times 10^{18}$ cm$^{-3}$.

9. A semiconductor device comprising:
   a semiconductor substrate;
   a first well area with a first conductivity type formed in a surface area of the semiconductor substrate;
   a second well area formed in a surface area of the semiconductor substrate;
   a plurality of element isolation areas formed in the first and second well areas;
   a first electrode with a second conductivity type of a bipolar transistor formed on a first area of the first well area which is isolated by the element isolation areas;
   a second electrode with the first conductivity type of the bipolar transistor formed on the first electrode;
   a third electrode with the first conductivity type of the bipolar transistor formed in a second area of the first well area which is isolated from the first area by the element isolation area; and
   a first low resistance area having a resistive value lower than that of the first well area, which is in contact with the element isolation areas, and is not in contact with a depletion layer of a junction portion of the bipolar transistor.
   wherein the first low resistance area is in contact with a base portion of the first well area and connects the first and second areas.

10. A semiconductor device comprising:
    a semiconductor substrate;
    a first well area formed in a surface area of the semiconductor substrate;
    a second well area formed in a surface area of the semiconductor substrate;
    an analog circuit formed in the first well area;
    a digital circuit formed in the second well area;
    an isolation area formed between the first and second well area; and
    a low resistance area provided at a base portion of the first well area excluding the second well area, the low resistance area having a resistive value lower than that of the first well area,
    wherein the low resistance area is not in contact with a depletion layer of the analog circuit and in contact with the isolation area.

11. The device according to claim 10, wherein the impurity concentration of the low resistance area is set to above 2 times that of the well area.

12. The device according to claim 10, wherein the impurity concentration of the low resistance area is set to above $1 \times 10^{18}$ cm$^{-3}$.

13. The device according to claim 11, wherein the impurity concentration of the first well area where the analog circuit is provided is set to be higher than that of the second well area where the digital circuit is provided.

14. The device according to claim 5, further comprising a second semiconductor layer with a second conductivity type formed at a third area of the second well area which is isolated by the element isolation areas, the second semiconductor layer configuring a first electrode of a capacitor;

a third semiconductor layer with the first conductivity type formed in a fourth area of the second well area which is isolated by the element isolation areas, the third semiconductor layer configuring a second electrode of the capacitor; and a second low resistance area with the first conductivity type which is provided at a base portion of the second well area and which connects the third area and the fourth area, the second low resistance area having a resistive value lower than that of the second well area, wherein the second low resistance area is not in contact with a depletion layer of a junction portion between the second semiconductor layer and the second well area, and is not in contact with a depletion layer of a junction portion between the third semiconductor layer and the second well area, and is in contact with the element isolation areas.

15. The device according to claim 14, further comprising a wiring layer connected to the second semiconductor layer and one of source/drain regions of the MOS transistor.

16. The device according to claim 1, wherein the capacitor is a variable capacitance capacitor.

17. The device according to claim 14, wherein the capacitor is a variable capacitance capacitor.

18. The device according to claim 9, further comprising a second semiconductor layer with a second conductivity type formed at a third area of the second well area which is isolated by the element isolation areas, the second semiconductor layer configuring a first electrode of a capacitor;

a third semiconductor layer with the first conductivity type formed in a fourth area of the second well area which is isolated by the element isolation areas, the third semiconductor layer configuring a second electrode of the capacitor; and a second low resistance area with the first conductivity type which is provided at a base portion of the second well area and which connects the third area and the fourth area, the second low resistance area having a resistive value lower than that of the second well area, wherein the second low resistance area is not in contact with a depletion layer of a junction portion between the second semiconductor layer and the second well area, and is not in contact with a depletion layer of a junction portion between the third semiconductor layer and the second well area, and is in contact with the element isolation areas.

19. The device according to claim 18, wherein the capacitor is a variable capacitance capacitor.

20. The device according to claim 1, wherein a bottom portion of the low resistance area is lower than that of the element isolation area.

21. The device according to claim 5, wherein a bottom portion of the low resistance area is lower than that of the element isolation area.

22. The device according to claim 9, wherein a bottom portion of the low resistance area is lower than that of the element isolation area.

* * * * *